(12) United States Patent
Pahl et al.

(10) Patent No.: US 9,061,888 B2
(45) Date of Patent: Jun. 23, 2015

(54) SENSOR MODULE AND METHOD FOR PRODUCING SENSOR MODULES

(75) Inventors: Wolfgang Pahl, Munich (DE); Gregor Feiertag, Munich (DE); Anton Leidl, Hohenbrunn (DE)

(73) Assignee: Epcos AG, Munich (DE)

( * ) Notice: Subject to any disclaimer, the term of this patent is extended or adjusted under 35 U.S.C. 154(b) by 339 days.

(21) Appl. No.: 13/190,732

(22) Filed: Jul. 26, 2011

(65) Prior Publication Data

US 2011/0298064 A1   Dec. 8, 2011

Related U.S. Application Data

(63) Continuation of application No. PCT/EP2010/051113, filed on Jan. 29, 2010.

(30) Foreign Application Priority Data

Feb. 6, 2009   (DE) .......................... 10 2009 007 837

(51) Int. Cl.
| | | |
|---|---|---|
| *H01L 29/84* | (2006.01) | |
| *B81B 7/00* | (2006.01) | |
| *B81C 1/00* | (2006.01) | |

(52) U.S. Cl.
CPC ......... *B81B 7/0048* (2013.01); *B81B 2207/092* (2013.01); *B81B 2207/096* (2013.01); *B81C 1/0023* (2013.01); *B81C 2203/0136* (2013.01); *H01L 2224/16225* (2013.01); *H01L 2924/1461* (2013.01)

(58) Field of Classification Search
CPC .................. H01L 2224/16; H01L 2924/01029; H01L 2924/01078; H01L 2224/16225; H01L 2924/1461; H01L 2924/00; H01L 23/057; H01L 25/105; H01H 59/0009; B81B 7/0048
USPC .......... 257/415, E29.234, E21.499, 778, 684; 438/50, 108
See application file for complete search history.

(56) References Cited

U.S. PATENT DOCUMENTS

| | | | |
|---|---|---|---|
| 5,859,759 A | 1/1999 | Moriyama et al. | |
| 6,154,370 A * | 11/2000 | Degani et al. | ................. 361/761 |
| 6,320,257 B1 * | 11/2001 | Jayaraj et al. | ................. 257/723 |
| 7,259,041 B2 * | 8/2007 | Stelzl et al. | .................... 438/106 |
| 7,282,786 B2 | 10/2007 | Jung et al. | |
| 2007/0090536 A1 | 4/2007 | Sakai et al. | |
| 2008/0093722 A1* | 4/2008 | Shishido | ....................... 257/684 |

(Continued)

FOREIGN PATENT DOCUMENTS

| | | |
|---|---|---|
| DE | 102004019428 A1 | 8/2005 |
| DE | 102005050398 A1 | 4/2007 |
| DE | 102006049004 A1 | 4/2007 |

(Continued)

OTHER PUBLICATIONS

Japanese Examination Report corresponding to co-pending Japanese Patent Application No. 2011-548652; Dated Jun. 18, 2014; (2 pages).

*Primary Examiner* — Thinh T Nguyen
(74) *Attorney, Agent, or Firm* — Nixon Peabody LLP

(57) ABSTRACT

Sensor module, comprising a carrier, at least one sensor chip and at least one evaluation chip which is electrically coupled to the sensor chip. The carrier has a cutout, in which the sensor chip is at least partly situated. The evaluation chip is arranged on the carrier and at least partly covers the cutout.

19 Claims, 3 Drawing Sheets

(56) References Cited

U.S. PATENT DOCUMENTS

| | | | |
|---|---|---|---|
| 2008/0227235 A1* | 9/2008 | Theuss et al. | 438/53 |
| 2009/0127697 A1 | 5/2009 | Pahl | |

FOREIGN PATENT DOCUMENTS

| | | |
|---|---|---|
| DE | 102007010711 A1 | 9/2008 |
| DE | 102008028757 A1 | 12/2009 |
| EP | 2056087 A1 | 6/2009 |
| JP | H08-226861 A1 | 9/1996 |
| JP | 2001-083174 A1 | 3/2001 |
| JP | 2002-082009 A1 | 3/2002 |
| JP | 2005-514847 A | 5/2005 |
| JP | 2005-169541 A1 | 6/2005 |
| JP | 2005-180930 A | 7/2005 |
| JP | 2006-173280 A1 | 6/2006 |
| JP | 2006-518673 A1 | 8/2006 |
| JP | 2007-035847 A1 | 2/2007 |
| JP | 2007-115964 A1 | 5/2007 |
| JP | 2008-103571 A1 | 5/2008 |
| JP | 2008-244317 A1 | 10/2008 |
| WO | 2004/074168 A2 | 9/2004 |

* cited by examiner

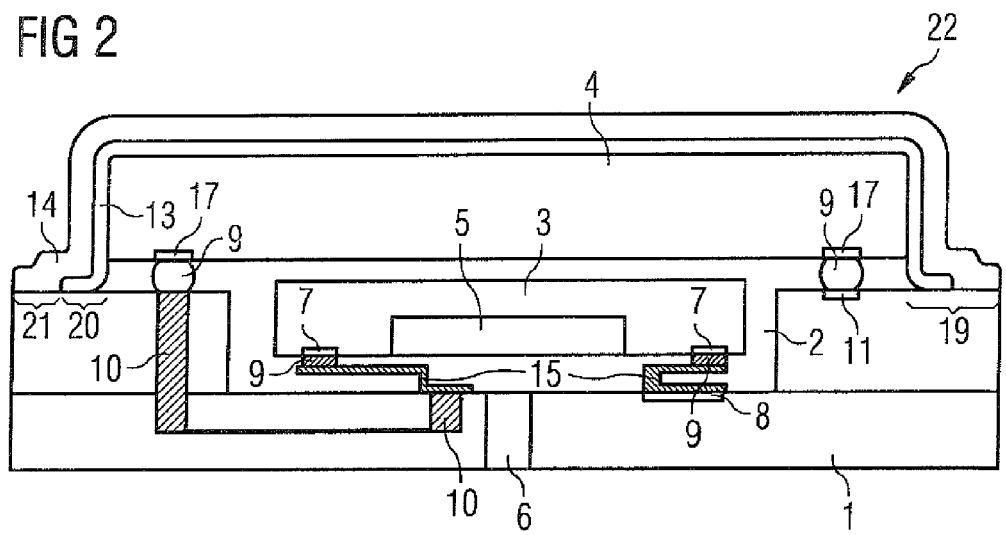
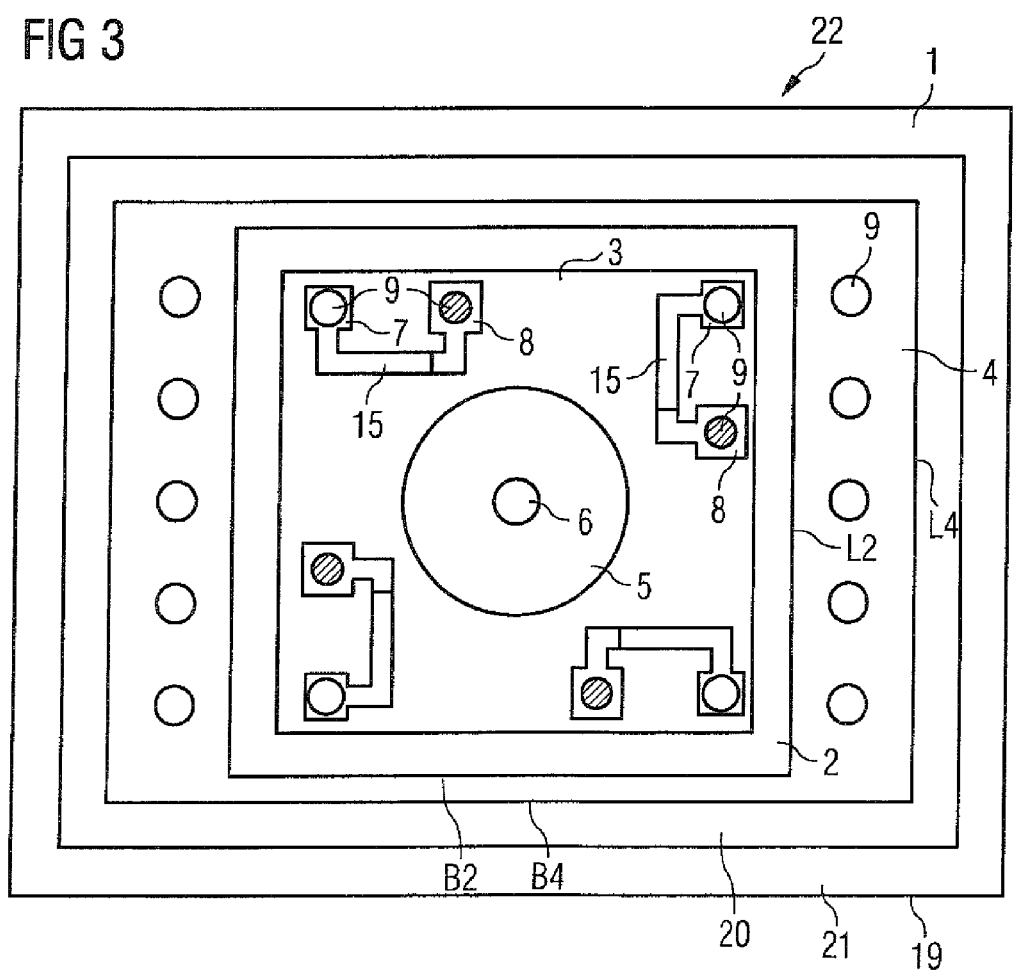

SENSOR MODULE AND METHOD FOR PRODUCING SENSOR MODULES

CROSS-REFERENCE TO RELATED APPLICATION

This application is a continuation of prior International Patent Application Serial No. PCT/EP2010/051113, filed Jan. 29, 2010, entitled "Sensor Module and Method for Producing Sensor Modules," which claims the benefit of priority of Germany Patent Application Serial No. 10 2009 007 837.1, filed in Germany on Feb. 6, 2009, each of which is hereby incorporated by reference.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND OF THE INVENTION

The invention relates to the mounting and housing of sensor modules. A sensor module generally consists of a sensor chip and an evaluation chip, which processes further the signals of the sensor chip. The chips can be mounted on a leadframe, or a panel, electrically contact-connected and then directly encapsulated with a molding compound. If the sensor chip is sensitive to mechanical strains, then the sensor chip and the evaluation chip can be constructed and contact-connected in cavity housings. The housing can be closed with a metal cover, for example, by adhesive bonding, soldering or welding.

BRIEF SUMMARY OF THE INVENTION

One challenge in the mounting and housing of sensor modules is to miniaturize the latter. Furthermore, the sensor chip has to be mounted in a suitable manner if it is sensitive to mechanical strains.

Therefore, it is an object of the invention to propose sensor modules which have very small housings and in which mechanical strains of the sensor chip are avoided.

The invention achieves the object by means of a sensor module, comprising a carrier, at least one sensor chip, and at least one evaluation chip which is electrically coupled to the sensor chip. The carrier has a cutout, wherein the sensor chip is at least partly situated in the cutout. The evaluation chip is arranged on the carrier and at least partly covers the cutout. The carrier with the cutout serves as a housing of the sensor chip and the evaluation chip serves as a cover, such that a separate cover can be obviated. In this case, the evaluation chip is larger at least in length or width than the length or width of the cutout and can bridge the latter.

In one development, the evaluation chip completely covers the cutout. The sensor chip is therefore completely surrounded by the carrier and the evaluation chip and is protected by them.

In one development, the sensor chip is completely situated in the cutout. The depth of the cutout is chosen such that the sensor chip is completely accommodated in the cutout, and so particularly flat sensor modules are obtained. The sensor chip can be thinned for this purpose.

In one development, the evaluation chip has electrical contact areas which face in the direction of the carrier and are electrically connected to first electrical contact areas of the carrier by means of flip-chip technology. The evaluation chip is thus fixed mechanically and electrically on the carrier with the aid of flip-chip technology. Since the electrical contact areas of the evaluation chip face in the direction of the carrier, they need not be protected toward the outside. Furthermore, via the first electrical contact areas of the carrier, electrical signals can be passed from and to the evaluation chip, which signals originate for example from the sensor chip or are conducted for further processing outside the sensor module.

In one development, the carrier has second electrical contact areas, which are electrically connected to the first electrical contact areas of the carrier via plated-through holes. The second electrical contact areas of the carrier can be connected for example to the electrical contact areas of the sensor chip, such that signals can be exchanged between the sensor chip and the evaluation chip.

In one development, the sensor chip is fixed in the cutout of the carrier by means of an elastic adhesive, wherein electrical contact areas of the sensor chip are electrically connected to the second electrical contacts of the carrier by means of bonding wires. The elastic adhesive and the bonding wires serve to ensure that no mechanical strains can act on the sensor chip.

In one development, the second electrical contact areas of the carrier are arranged in the cutout, and the electrical contact areas of the sensor chip are connected to the second electrical contact areas of the carrier by means of flip-chip technology. Since no extra space for bonding wires and bonding pads is required in flip-chip technology, this embodiment is particularly suitable if the evaluation chip is not much larger than the sensor chip. In this case, the sensor chip is connected to the evaluation chip via the plated-through holes.

In one development, the electrical contact areas of the sensor chip are electrically connected to the second electrical contact areas of the carrier by means of conductive spring elements, wherein the sensor chip is mechanically connected only to the conductive spring elements. As a result of flip-chip technology, mechanical strains of the carrier could be transmitted directly to the sensor chip. However, if the latter is connected to the carrier only by means of conductive spring elements, then mechanical strains of the carrier affect the sensor chip only to a small extent.

In one development, at least one conductive spring element has at least two angled portions. In one development, the angled portions face in at least two different spatial directions. By means of the angled portions in different spatial directions, mechanical strains from a plurality of directions can be taken up in the conductive spring elements and are thus forwarded to the sensor chip only in a greatly damped fashion.

In one development, the sensor chip is fixed on that side of the evaluation chip which has the electrical contact areas of the evaluation chip. Since the evaluation chip and the sensor chip generally consist of the same material, for example silicon, this is a thermomechanically expedient combination since practically no strains occur in the event of a temperature change. At the same time, the sensor chip is mechanically stabilized by the evaluation chip.

In one development, the electrical contact areas of the sensor chip are electrically connected to the electrical contact areas of the evaluation chip by means of flip-chip technology. Flip-chip technology gives rise to a space-saving mechanical and electrical connection of the sensor chip to the evaluation chip.

In one development, the electrical contact areas of the sensor chip are electrically connected to the electrical contact areas of the evaluation chip by means of bonding wires. Transmissions of mechanical strains from the evaluation chip to the sensor chip can be reduced by means of bonding wires.

In one development, a further cutout for accommodating the bonding wires is provided in the carrier. The further cutout makes it possible to reduce the space required for the bonding wires, such that the sensor module can be constructed in a smaller fashion.

In one development, a seal is provided, which is arranged between the evaluation chip and the carrier. The seal serves to protect the sensor chip and the side of the evaluation chip which has the electrical contact areas against environmental influences, such as moisture, for example. In this case, the seal can be hermetically impermeable.

In one development, the seal comprises a solder frame, an adhesive or an underfiller. By means of these elements, the space that arises between the carrier and the evaluation chip as a result of the conductive connection in the case of flip-chip technology can be filled, such that the inner elements of the sensor module are protected against environmental influences and the flip-chip connection is mechanically stabilized.

In one development, a first layer is applied on the evaluation chip and the carrier, wherein the first layer completely covers the cutout and together with the carrier completely surrounds the evaluation chip. The first layer has at least one thermoplastic layer, a thermosetting plastic layer, a hot melt adhesive coating or a reaction adhesive coating. Since the first layer completely covers the cutout and surrounds the evaluation chip, it can be used to protect the sensor module against environmental influences.

In one development, at least one further layer is applied on the first layer, wherein at least one of the further layers is a metallic layer. A metallic layer can improve the impermeability and mechanical robustness of the sensor module and shield the latter against electromagnetic radiation.

In one development, the evaluation chip is smaller than the carrier, such that at least one margin from an edge of the evaluation chip to an edge of the carrier is present on the carrier. The first layer covers an inner part of the margin and does not cover an outer part of the margin. The further layer completely covers the first layer and is connected to the carrier in the outer part of the margin. By virtue of the fact that the first layer does not cover the outer part of the margin, the metallic layer of the further layers can be connected to the carrier in an impermeable and fixedly adhering manner. This construction improves the impermeability and at the same time the mechanical stiffness of the sensor module.

In one development, the margin extends around the evaluation chip in a closed and frame-type fashion. In this way, the sensor module can be hermetically sealed on all sides.

In one development, the evaluation chip is an amplifier or an application specific integrated circuit (ASIC), and the sensor chip is a microelectromechanical system (MEMS). Owing to the decoupling of mechanical and thermal strains, the housing is particularly suitable for microelectromechanical systems, which react sensitively to said strains. With the evaluation chip or the application specific integrated circuit, the signals of the microelectromechanical system can be processed further in a space-saving manner.

In one development, the microelectromechanical system is a pressure sensor, a microphone, a moisture sensor or an acceleration sensor.

In one development, the carrier is composed of ceramic. Ceramics have high mechanical strengths and can also contain the required electrical contact areas and plated-through holes.

In one development, the sensor chip has a thickness of 100 µm to 200 µm, and the evaluation chip has a thickness of 200 µm to 400 µm. Since only low mechanical and thermal strains occur, it is possible to thin the chip thicknesses, such that the height of the sensor module overall can be greatly reduced.

The invention furthermore provides a method for producing sensor modules, wherein at least the first layer is applied over a plurality of sensor modules arranged using panel technology, and the sensor modules are subsequently singulated. The joint processing of the sensor modules makes it possible to reduce handling steps, which contributes to lower costs of the sensor modules.

The invention is described below on the basis of exemplary embodiments with the aid of figures.

BRIEF DESCRIPTION OF THE DRAWINGS

FIG. 2 shows a cross section through an exemplary embodiment wherein the sensor chip is connected to the carrier by means of conductive spring elements;

FIG. 3 shows a plan view of FIG. 2;

DETAILED DESCRIPTION OF THE INVENTION

Figure 1:
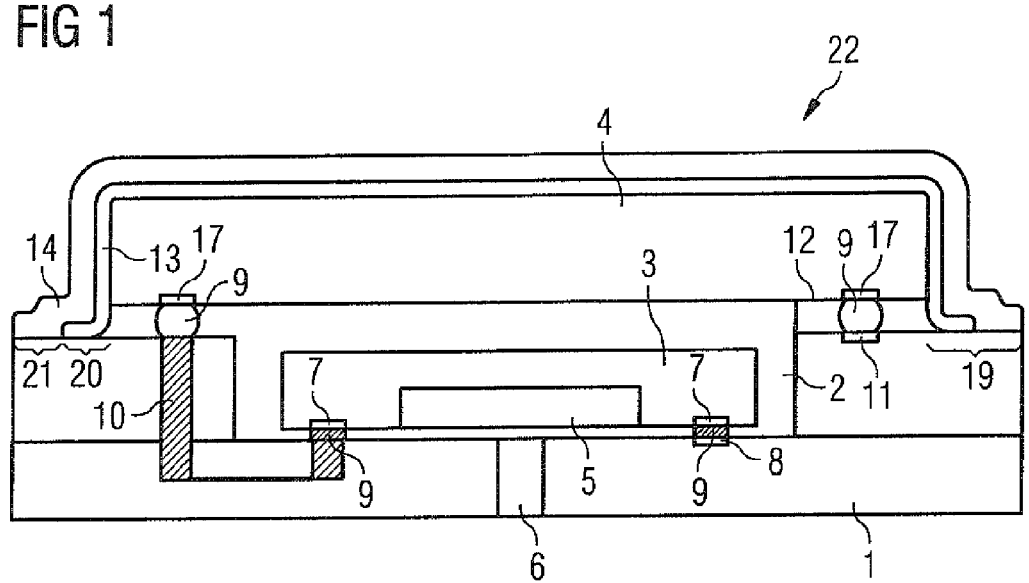
FIG. 1 shows a cross section through an exemplary embodiment wherein the sensor chip is fixed on the carrier by means of flip-chip technology.

FIG. 1 shows a cross section through an exemplary embodiment of a sensor module 22. A carrier 1 has a cutout 2, in which a sensor chip 3 is mounted at the bottom of the cutout by means of flip-chip technology. An evaluation chip 4 covers the cutout 2 and the sensor chip 3. In this case, the carrier 1 can consist of ceramic, for example can consist of high temperature cofired ceramic (HTCC) or low temperature cofired ceramic (LTCC). This type of ceramic can contain metal structurings that enable plated-through holes 10. In this case, the carrier 1 can consist of a baseplate, onto which a frame is placed.

The sensor chip 3 can be a pressure sensor, a microphone or an acceleration sensor, which have, for example, microelectromechanical systems (MEMS). Other types of sensors are likewise possible. By way of example, FIG. 1 shows a pressure sensor wherein the sensor chip 3 has a membrane 5 and the carrier 1 has an opening 6, through which the pressure to be measured can reach the sensor chip 3. The opening 6 can also be formed at other locations of the sensor module 22.

The sensor chip 3 has electrical contact areas 7, by means of which the measurement signals can be tapped off. The electrical contact areas 7 are connected to second electrical contact areas 8 of the carrier 1 by means of the conductive connections 9, which can be solder balls, gold stud bumps or conductive adhesives. However, "face-up" mounting is also possible, wherein the electrical contact areas 7 of the sensor chip 3 are connected to the second electrical contact areas 8 of the carrier 1 by means of bonding wires. This type of contact-connection is not disadvantageous if the evaluation chip 4 is significantly larger than the sensor chip 3, since the required plan layout for the laterally extending bonding wires is then available anyway. What is advantageous in the case of contact-connection with bonding wires is that mechanical strains of the carrier 1—in contrast to flip-chip technology—are not transmitted directly to the sensor chip 3. The decoupling of mechanical strains can be improved further if the sensor chip 3 is connected to the carrier 1 by means of a soft adhesive film. Such an adhesive film could consist of silicone rubber, for example, and have a thickness of greater than 50 µm.

The carrier 1 furthermore has first electrical contact areas 11, to which the electrical contact areas 17 of the evaluation chip are contact-connected by means of conductive connections 9. The first electrical contact areas 11 and the second electrical contact areas 8 of the carrier 1 can be connected to one another via plated-through holes 10. In this way, sensor signals can pass to the evaluation circuit 4, where they are processed further.

FIG. 1 does not show contact-connections of the sensor module 22 by means of which the processed sensor signals can be tapped off from the evaluation chip 4 and, for example, the evaluation chip 4 can be driven. These can be led through further plated-through holes for example to contact areas at the underside of the carrier 4, by means of which the sensor module 22 can be connected by means of surface mounted device (SMD) technology.

The evaluation chip 4 is placed onto the carrier 1 "face-down", that is to say with its electrical contact areas 17 facing in the direction of the carrier 1, as a covering of the cutout 2. The evaluation chip 4 is connected to the carrier 1 by means of flip-chip technology. The evaluation chip 4 is larger than the cutout 2 at least in length or width and is suitable for at least partly bridging the cutout. The sensor chip 3 is thereby protected by the carrier 1 on one side and by the evaluation chip 4 on the other side.

The right-hand side of FIG. 1 depicts a seal 12, which impermeably connects the evaluation chip 4 and the carrier 1. It can lie between the evaluation chip 4 and the carrier 1 and surround the conductive connections 9. The seal 12 can be a curing polymer, for example, which is applied in said region. It can also be an underfiller, which propagates by capillary forces in the connecting region, or an adhesive, which is applied locally by means of a jet printing method, for example.

A first layer 13 can be applied over the evaluation chip 4, which first layer can be for example a thermoplastic film, a film with a hot melt adhesive coating, a material having a "B-stage", that is to say having a plastic and tacky intermediate state in the curing reaction of a thermosetting polymer, or a film with a reaction adhesive coating. It is particularly advantageous if many sensor modules 22 arranged in an areal fashion are jointly provided with the first layer 13 in one step using panel technology. In contrast to the illustration in FIG. 1, in this case the space between adjacent sensor modules 22 can also be filled, such that parallelepipedial parts are present after singulation. In this case, the first layer 13 can be situated above the entire evaluation chip 4 in a hood-type fashion and can be connected to the carrier 1 on all sides.

If an improved impermeability or a hermetic termination of the sensor module 22 is required, or if an electromagnetic shield is necessary, then a further layer 14 can be provided above the first layer 13, said further layer containing a metal layer. In this case, the first layer 13 and the further layer 14 can be a composite film. The further layer 14 can also be an additional coating which arises, for example, by the application of a seed layer composed of metals such as titanium, tungsten, chromium by sputtering, and subsequent electrolytic reinforcement with copper or nickel, for example, and has a total layer thickness of 5 µm to 100 µm. The first layer 13 can have a thickness of 20 µm to 200 µm.

In order that the metal layer of the further layer 14 can be connected to the carrier 1 in an impermeable and fixedly adhering manner, it is advantageous to embody an outer part 21 of the margin 19 without the first layer 13. In this case, the margin 19 arises from the edge of the evaluation chip 14 to the edge of the carrier 1; see also the plan view in FIGS. 3 and 5. In the inner part 20 of the margin 19, only the first layer 13 is connected to the carrier 1, while in the outer part 21 only the further layer 14 is connected to the carrier 1. In this case, the further layer 14 is fitted above the entire first layer 13 in a hood-type fashion and seals the device further. In the case of metal layers having a thickness of more than 30 µm, such sensor modules 22 exhibit good mechanical stiffnesses which are stable with respect to loads, such as, for example, the pick-and-place process during the population of printed circuit boards.

FIG. 2 differs from FIG. 1 in that mechanical strains of the carrier 1 are kept away from the sensor chip 3 to the greatest possible extent by means of conductive spring elements 15. The conductive spring elements 15 serve for making electrical contact with the sensor chip 3 and also fix the latter mechanically. Since the sensor chip 3 is supported only by the conductive spring elements 15, mechanical and thermal strains can be compensated for. The conductive spring elements 15 can be embodied as metal structures which, by means of a sacrificial layer process, are partly detached from the carrier 8 and thereby form particularly soft springs. The resilient metal structures are preferably produced by means of photolithographic methods on the bottom of the carrier. In this case, they can be etched from layers deposited over the whole area, or they are constructed electrolytically in the openings of a photoresist structure. In this case, locally provided sacrificial layer structures define regions in which the springs are free after the final removal of resist layer and sacrificial layer. The conductive spring elements 15 can be angled, preferably at least twice.

FIG. 3 shows a plan view of FIG. 2. The conductive spring elements 15 can be angled in at least two different spatial directions, such that mechanical and thermal strains from different directions can be taken up. Instead of a fixed conductive connection 9, as is used in flip-chip technology, the electrical contact areas 7 of the sensor chip 3 are elastically connected to the second electrical contact areas 8 of the carrier 1 by the conductive spring elements 15.

It can furthermore be seen in FIG. 3 that the evaluation chip 4 has a width B4 and a length L4 that are respectively greater than the width B2 and the length L2 of the cutout 2. In principle, the evaluation chip 4 can be smaller than the cutout 2 at least in one direction. In this case, the first layer 13, and, if appropriate, the further layer 14 would cover gaps in the covering of the cutout 2.

FIG. 3 also shows the margin 19 having an inner part 20 and outer part 21. In this case, the margin 19 can extend around the evaluation chip 4 in a closed and frame-type fashion.

Figure 4:
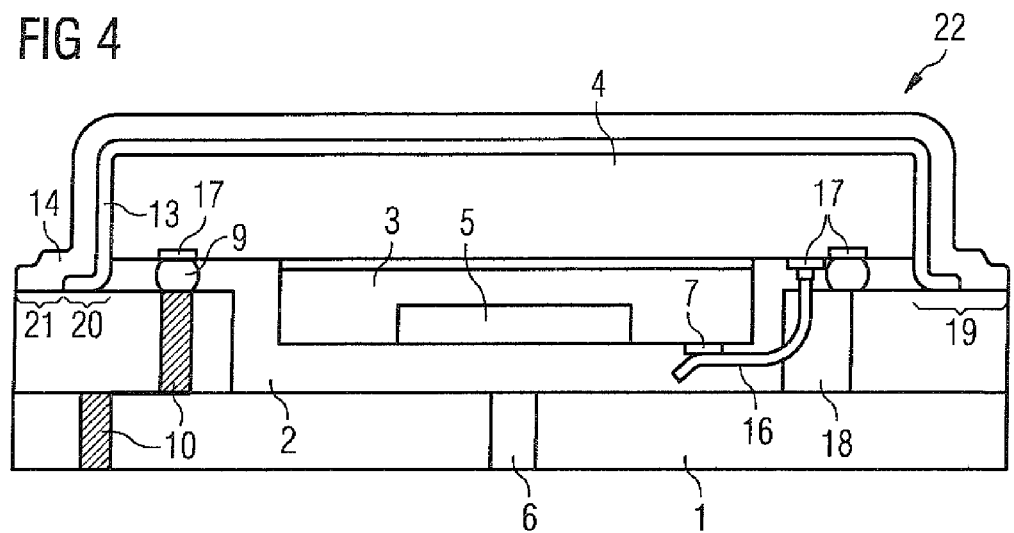
FIG. 4 shows a cross section through an exemplary embodiment wherein the sensor chip is fixed to the evaluation chip.

FIG. 4 shows a cross section through an exemplary embodiment of a sensor module wherein the sensor chip 3 is no longer connected to the carrier 1, but rather is fixed on the evaluation chip 4. This can be done by adhesive bonding, for example, before the wafer of the evaluation chip 4 is sawn. The arrangement shown in FIG. 4 is thermomechanically very expedient since the evaluation chip 4 and the sensor chip 3 generally consist of the same material, such as silicon, for example. Consequently, different linear expansions do not arise in the event of temperature changes. Furthermore, the sensor chip 3 experiences mechanical stabilization by the evaluation chip 4 and, moreover, is not connected to the carrier 1 mechanically. This gives rise to a sensor module 22 which has low inherent stresses and is robust toward external mechanical strains.

The electrical contact areas 7 of the sensor chip 3 are electrically contact-connected to the electrical contact areas 17 of the evaluation chip by means of bonding wires 16. In order to save space for the bonding wires and thus to obtain smaller sensor modules 22, a further cutout 18 can be provided, in which the bonding wires 16 run. It is also possible, of course, to replace the adhesive bonding and wire bonding by flip-chip technology, wherein the electrical contact areas 7 of the sensor chip 3 are connected to the electrical contact areas 17 of the evaluation chip 4.

Figure 5:
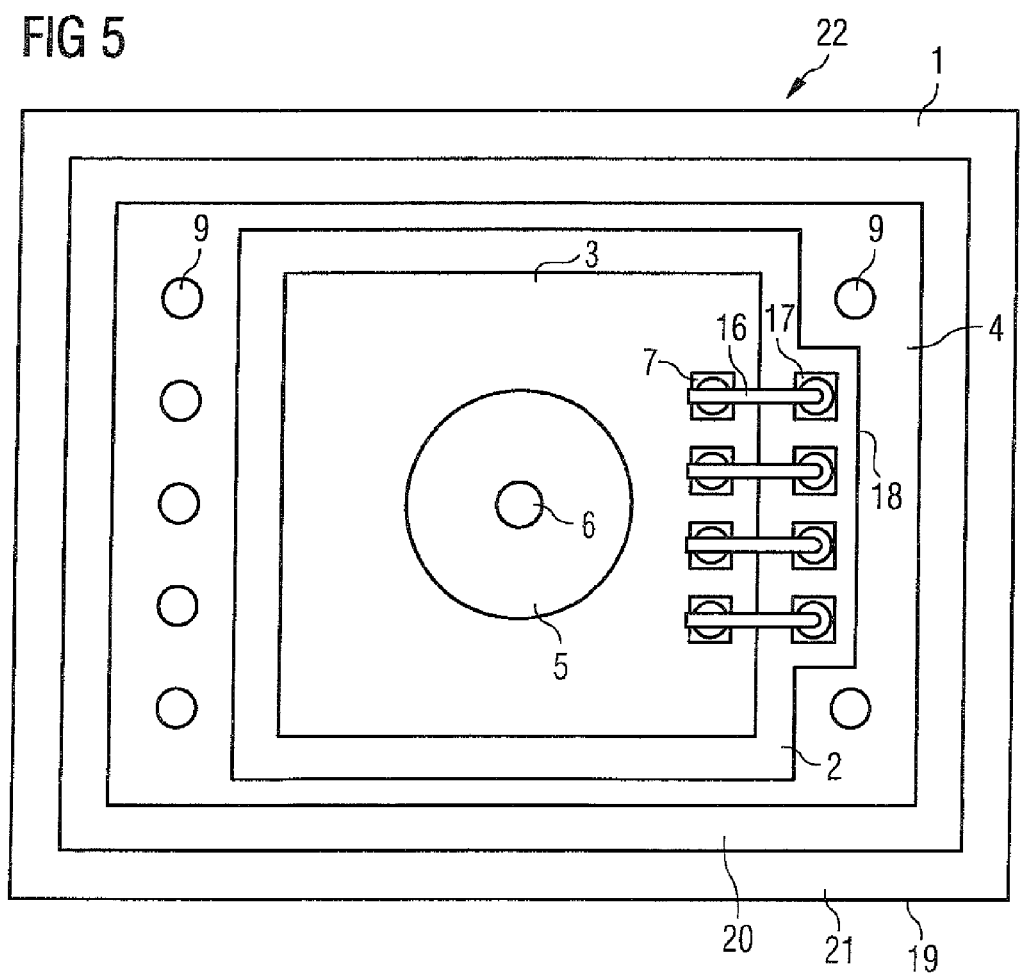
FIG. 5 shows a plan view of FIG. 4.

FIG. 5 shows a plan view of FIG. 4, showing the further cutout 18 and the course of the bonding wires 16. The evaluation chip 4 can be connected via flip-chip contacts and the plated-through holes 9 to external connections, which are, for example, SMD soldering pads on the underside of the carrier 1, in order thus to be able to forward the sensor signals.

In all the exemplary embodiments, the arrangement of the evaluation chip 4 above the sensor chip 3 allows a very small area requirement of the sensor module 22. Since, as described, mechanical and thermal strains are reduced, it is possible for the evaluation chip 4 and the sensor chip 3 to be thinned. Given a thickness of the base of the carrier 1 in the region of the thinning of typically 100 µm to 300 µm and chip thicknesses of 100 µm to 200 µm for the sensor chip 3 and 200 µm to 400 µm for the evaluation chip 4, sensor modules having total heights of one millimeter or less can be obtained.

What is claimed is:

1. A sensor module, comprising
a carrier;
at least one sensor chip;
at least one evaluation chip electrically coupled to the sensor chip, wherein
the carrier has a cutout,
the sensor chip is completely situated in the cutout, the sensor chip having electrical contact areas, the carrier having second electrical contact areas, and
the evaluation chip is arranged on the carrier and completely covers the cutout;
conductive connections connecting respective electrical contact areas of the sensor chip with corresponding second electrical contact areas of the carrier, wherein the electrical contact areas of the sensor face in the direction of the carrier; and
a first layer on the evaluation chip and on the carrier, wherein the first layer completely covers the cutout and together with the carrier completely surrounds the evaluation chip, wherein the first layer has at least one thermoplastic layer, a thermosetting plastic layer, a hot melt adhesive coating, or a reaction adhesive coating, wherein the evaluation chip has electrical contact areas that face in the direction of the carrier and are electrically connected to first electrical contact areas of the carrier by flip-chip technology, and wherein the carrier has second electrical contact areas that are electrically connected to the first electrical contact areas of the carrier via plated-through holes.

2. The sensor module according to claim 1, wherein
the sensor chip is fixed in the cutout of the carrier by an elastic adhesive, and
the electrical contact areas of the sensor chip are electrically connected to the second electrical contact areas of the carrier by bonding wires.

3. The sensor module according to claim 1, wherein
the second electrical contact areas of the carrier are arranged in the cutout, and
the electrical contact areas of the sensor chip are connected to the second electrical contact areas of the carrier by flip-chip technology.

4. The sensor module according to claim 3, wherein the electrical contact areas of the sensor chip are electrically connected to the second electrical contact areas of the carrier by conductive spring elements, wherein the sensor chip is mechanically connected only to the conductive spring elements.

5. The sensor module according to claim 4, wherein at least one conductive spring element has at least two angled portions.

6. The sensor module according to claim 5, wherein the angled portions face in at least two different spatial directions.

7. The sensor module according to claim 1, wherein the sensor chip is fixed on that side of the evaluation chip which has the electrical contact areas of the evaluation chip.

8. The sensor module according to claim 7, wherein the electrical contact areas of the sensor chip are electrically connected to the electrical contact areas of the evaluation chip by flip-chip technology.

9. The sensor module according to claim 7, wherein the electrical contact areas of the sensor chip are electrically connected to the electrical contact areas of the evaluation chip by bonding wires.

10. The sensor module according to claim 9, wherein a further cutout for accommodating the bonding wires is provided in the carrier.

11. The sensor module according to claim 1, wherein a seal is provided and arranged between the evaluation chip and the carrier.

12. The sensor module according to claim 11, wherein the seal comprises a solder frame, an adhesive or an underfiller.

13. The sensor module according to claim 1, wherein
at least one further layer is applied on the first layer, wherein at least one of the further layers is a metallic layer.

14. The sensor module according to claim 13, wherein
the evaluation chip is smaller than the carrier, such that at least one margin from an edge of the evaluation chip to an edge of the carrier is present on the carrier,
the first layer covers an inner part of the margin and does not cover an outer part of the margin, and
the further layer completely covers the first layer and is connected to the carrier in the outer part of the margin.

15. The sensor module according to claim 14, wherein the margin extends around the evaluation chip in a closed and frame-type fashion.

16. The sensor module according to claim 1, wherein
the evaluation chip is an amplifier or an application specific integrated circuit, and
the sensor chip is a microelectromechanical system.

17. The sensor module according to claim 16, wherein the microelectromechanical system includes a pressure sensor, a microphone, a moisture sensor or an acceleration sensor.

18. The sensor module according to claim 1, wherein the carrier is composed of ceramic.

19. The sensor module according to claim 16, wherein the sensor chip has a thickness between 100 µm and 200 µm, and the evaluation chip has a thickness between 200 µm and 400 µm.

* * * * *